US012568705B2

(12) United States Patent
    Patel

(10) Patent No.: US 12,568,705 B2
(45) Date of Patent: Mar. 3, 2026

(54) PHASE DETECTION AUTOFOCUS PIXEL

(71) Applicant: Apple Inc., Cupertino, CA (US)

(72) Inventor: Manoj C. Patel, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 629 days.

(21) Appl. No.: 17/952,170

(22) Filed: Sep. 23, 2022

(65) Prior Publication Data

US 2024/0105747 A1     Mar. 28, 2024

(51) Int. Cl.

| | |
|---|---|
| *H10F 39/00* | (2025.01) |
| *H04N 23/84* | (2023.01) |
| *H04N 25/704* | (2023.01) |
| *H10F 39/18* | (2025.01) |
| *G02B 3/00* | (2006.01) |
| *G02B 5/20* | (2006.01) |

(52) U.S. Cl.
    CPC ......... *H10F 39/8063* (2025.01); *H04N 23/84* (2023.01); *H04N 25/704* (2023.01); *H10F 39/182* (2025.01); *H10F 39/8053* (2025.01); *G02B 3/0056* (2013.01); *G02B 5/201* (2013.01)

(58) Field of Classification Search
    CPC .............. G02B 2003/0093; G02B 3/00; G02B 3/0096; G02B 3/0037; G02B 3/0056; G02B 3/0062; G02B 3/0068; G02B 3/02; G02B 5/20; G02B 5/201; H04N 23/80; H04N 23/84; H04N 25/70; H04N 25/703; H04N 25/704; H10F 39/12; H10F 39/18; H10F 39/189; H10F 39/80; H10F 39/803; H10F 39/805; H10F 39/8053; H10F 39/8063
    See application file for complete search history.

(56) References Cited

U.S. PATENT DOCUMENTS

| | | | |
|---|---|---|---|
| 10,215,555 B2 * | 2/2019 | Chen | G01B 11/14 |
| 10,397,465 B2 | 8/2019 | Galor Gluskin et al. | |
| 10,440,301 B2 * | 10/2019 | Li | H04N 23/12 |
| 10,567,636 B2 * | 2/2020 | Galor Gluskin | H10F 39/18 |
| 10,573,678 B2 * | 2/2020 | Chapman | G02B 3/0018 |
| 10,612,910 B2 * | 4/2020 | Chen | G01D 5/2013 |
| 10,957,727 B2 * | 3/2021 | Lee | H10F 39/18 |
| 10,999,544 B2 * | 5/2021 | Wang | H04N 25/11 |
| 11,490,000 B2 * | 11/2022 | Feng | H04N 23/672 |
| 12,266,669 B2 * | 4/2025 | Cho | H04N 25/704 |
| 2015/0062390 A1 * | 3/2015 | Kim | H10F 39/8063 348/273 |
| 2016/0269662 A1 * | 9/2016 | Hepper | H04N 23/672 |
| 2019/0045111 A1 * | 2/2019 | Galor Gluskin | H04N 23/815 |
| 2019/0082130 A1 * | 3/2019 | Li | H10F 39/807 |
| 2019/0281226 A1 * | 9/2019 | Wang | H04N 25/778 |
| 2020/0029035 A1 * | 1/2020 | Agranov | H04N 9/646 |
| 2021/0385400 A1 | 12/2021 | Jung et al. | |
| 2022/0132079 A1 * | 4/2022 | Choi | H04N 25/78 |
| 2022/0149097 A1 | 5/2022 | Li et al. | |
| 2022/0232184 A1 | 7/2022 | Lee | |
| 2023/0005980 A1 * | 1/2023 | Kim | H10F 39/8063 |
| 2024/0105747 A1 * | 3/2024 | Patel | H10F 39/8053 |

* cited by examiner

*Primary Examiner* — Georgia Y Epps

(74) *Attorney, Agent, or Firm* — Fish & Richardson P.C.

(57) ABSTRACT

Embodiments are disclosed for a Phase Detection Autofocus (PDAF) pixel, including a photodiode; a color filter disposed on the photodiode; and a parabolic-shaped microlens disposed on the color filter and oriented in a direction that generates an angular response, such that a phase disparity signal is generated in a horizontal or vertical direction of an imaging plane or both directions.

20 Claims, 13 Drawing Sheets

PDAF PIXEL
(LEFT)
500

PARABOLIC
LENS
502

COLOR
FILTER
506

PHOTODIODE

308
DEEP TRENCH
ISOLATION

308
DEEP TRENCH
ISOLATION

PDAF PIXEL
(LEFT)
500

PARABOLIC
LENS
502

COLOR
FILTER
506

308
DEEP TRENCH
ISOLATION

PHOTODIODE

308
DEEP TRENCH
ISOLATION

PHASE DETECTION AUTOFOCUS PIXEL

TECHNICAL FIELD

This disclosure relates generally to Phase Detection Auto-focus (PDAF) pixels.

BACKGROUND

A lens element is used in a digital camera to focus light on the surface of an image sensor. The lens position relative to the sensor surface is adjusted to get the best focus for the object of interest in the scene being captured, either in a still photo or video. PDAF pixels have been widely used in the image sensor to provide a phase disparity signal to an autofocus system of the digital camera. The phase disparity signal is derived by the phase difference between PDAF pixels distributed among imaging pixels in the image sensor. When light is focused in an imaging plane, the phase disparity is zero. When light is not focused in the imaging plane, the phase disparity is proportional to the distance a primary lens should be moved to bring the light into focus at the imaging plane.

SUMMARY

Embodiments are disclosed for PDAF pixels. In some embodiments, each PDAF pixel includes a parabolic-shaped microlens, and each PDAF pixel is placed in a different orientation (position and/or direction) with respect to each other. A pair of PDAF pixels can have different angular responses, which results in a phase disparity signal for the autofocus of a digital camera. In some embodiments, two pairs of PDAF pixels can be placed on a green color channel. In some embodiments, two pairs of PDAF pixels can be placed on a blue color channel, and a blue color filter of the blue color channel is replaced with a green color filter.

In an embodiment, a PDAF pixel includes: a photodiode; a color filter disposed on the photodiode; and a parabolic-shaped microlens disposed on the color filter and oriented in a direction that generates an angular response, such that a phase disparity signal is generated in a horizontal or vertical direction of an imaging plane or both directions.

In an embodiment, an image sensor includes a plurality of imaging pixels and at least a pair of PDAF pixels. Each PDAF pixel includes: a photodiode; a color filter disposed on the photodiode; and a parabolic-shaped microlens disposed on the color filter and oriented in a direction that generates an angular response, such that a phase disparity signal is generated in a horizontal or vertical direction of an imaging plane or both directions.

In an embodiment, the pair of PDAF pixels are placed on a green color channel of a pixel array.

In an embodiment, the pair of PDAF pixels are placed on a blue color channel of a pixel array, and a blue color filter of the blue color channel is replaced with a green color filter.

In an embodiment, the pair of PDAF pixels includes a PDAF pixel having a parabolic-shaped microlens facing towards left and a PDAF pixel having a parabolic-shaped microlens facing towards right.

In an embodiment, the pair of PDAF pixels includes a PDAF pixel having a parabolic-shaped microlens facing towards top and a PDAF pixel having a parabolic-shaped microlens facing towards bottom.

In an embodiment, wherein the image sensor includes a first pair of PDAF pixels and a second pair of PDAF pixels, wherein the first pair of PDAF pixels are oriented to provide a first phase disparity signal in a horizontal direction, and the second pair of PDAF pixels are oriented to provide a second phase disparity signal in a vertical direction.

In an embodiment, wherein the first pair of PDAF pixels and the second pair of PDAF pixels are placed on a green color channel of a pixel array.

In an embodiment, wherein the first pair of PDAF pixels and the second pair of PDAF pixels are placed on a blue color channel of a pixel array, and a blue color filter of the blue color channel is replaced with a green color filter.

In an embodiment, wherein the first pair of PDAF pixels includes a PDAF pixel having a parabolic-shaped microlens facing towards left and a PDAF pixel having a parabolic-shaped microlens facing towards right, and the second pair of PDAF pixels includes a PDAF pixel having a parabolic-shaped microlens facing towards top and a PDAF pixel having a parabolic-shaped microlens facing towards bottom.

In an embodiment, wherein each imaging pixel includes a convex or elliptical shaped microlens.

In an embodiment, a mobile device includes an image sensor. The image sensor includes a plurality of imaging pixels and at least a pair of PDAF pixels. Each PDAF pixel includes: a photodiode; a color filter disposed on the photodiode; and a parabolic-shaped microlens disposed on the color filter and oriented in a direction that generates an angular response, such that a phase disparity signal is generated in a horizontal or vertical direction of an imaging plane or both directions.

In an embodiment, the pair of PDAF pixels are placed on a green color channel of a pixel array.

In an embodiment, the pair of PDAF pixels are placed on a blue color channel of a pixel array, and a blue color filter of the blue color channel is replaced with a green color filter.

In an embodiment, the pair of PDAF pixels includes a PDAF pixel having a parabolic-shaped microlens facing towards left and a PDAF pixel having a parabolic-shaped microlens facing towards right.

In an embodiment, the pair of PDAF pixels includes a PDAF pixel having a parabolic-shaped microlens facing towards top and a PDAF pixel having a parabolic-shaped microlens facing towards bottom.

In an embodiment, the image sensor includes a first pair of PDAF pixels and a second pair of PDAF pixels, wherein the first pair of PDAF pixels are oriented to provide a first phase disparity signal in a horizontal direction, and the second pair of PDAF pixels are oriented to provide a second phase disparity signal in a vertical direction.

In an embodiment, the first pair of PDAF pixels and the second pair of PDAF pixels are placed on a green color channel of a pixel array.

In an embodiment, the first pair of PDAF pixels and the second pair of PDAF pixels are placed on a blue color channel of a pixel array, and a blue color filter of the blue color channel is replaced with a green color filter.

In an embodiment, the first pair of PDAF pixels includes a PDAF pixel having a parabolic-shaped microlens facing towards left and a PDAF pixel having a parabolic-shaped microlens facing towards right, and the second pair of PDAF pixels includes a PDAF pixel having a parabolic-shaped microlens facing towards top and a PDAF pixel having a parabolic-shaped microlens facing towards bottom.

Other embodiments can include an apparatus, computing device, and non-transitory, computer-readable storage medium.

Particular embodiments disclosed herein provide one or more of the following advantages. In some embodiments, two or more pairs of PDAF pixels provide a phase disparity signal that is generated in an either horizontal or vertical direction of the imaging plane or both directions. In some embodiments, the PDAF pixels are placed on a green color channel. In some embodiments, the PDAF pixels are placed on a green color channel, and a blue color filter of the blue color channel is replaced with a green color filter.

The details of one or more implementations of the subject matter are set forth in the accompanying drawings and the description below. Other features, aspects, and advantages of the subject matter will become apparent from the description, the drawings, and the claims.

DETAILED DESCRIPTION

The PDAF pixel configuration of this disclosure is provided to improve autofocus performance, especially under low light conditions. Each PDAF pixel of this disclosure includes a parabolic-shaped microlens, and each PDAF pixel is placed in a different orientation with respect to each other, such that a phase disparity signal can be generated in an either horizontal or vertical direction of the imaging plane, or both directions. In some embodiments, the PDAF pixels are placed uniformly across the entire pixel array.

Figure 1:
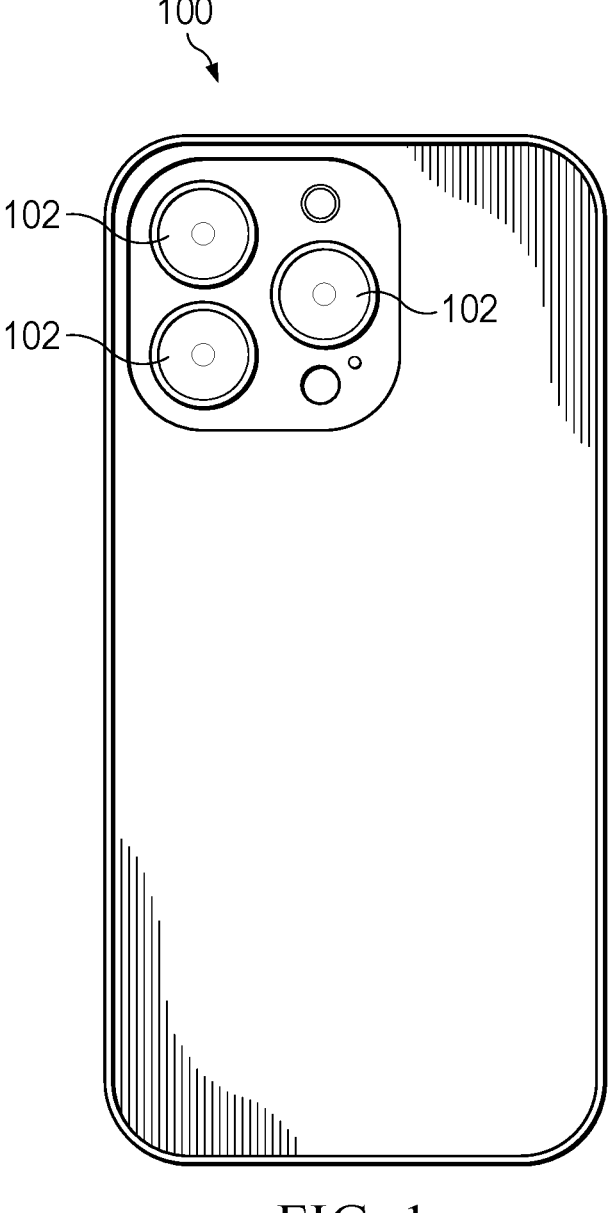
FIG. 1 is a perspective view of an example mobile device including cameras, according to an embodiment.

FIG. 1 is a perspective view of an example mobile device 100 including cameras, according to an embodiment. In the example shown, mobile device 100 is a smartphone. However, mobile device 100 can also be, a tablet computer, smartwatch, dedicated camera system, etc. Mobile device 100 includes one or more cameras 102 that include one or more image sensors, such as CMOS sensors or charge-coupled devices (CCD), etc.

Figure 2:
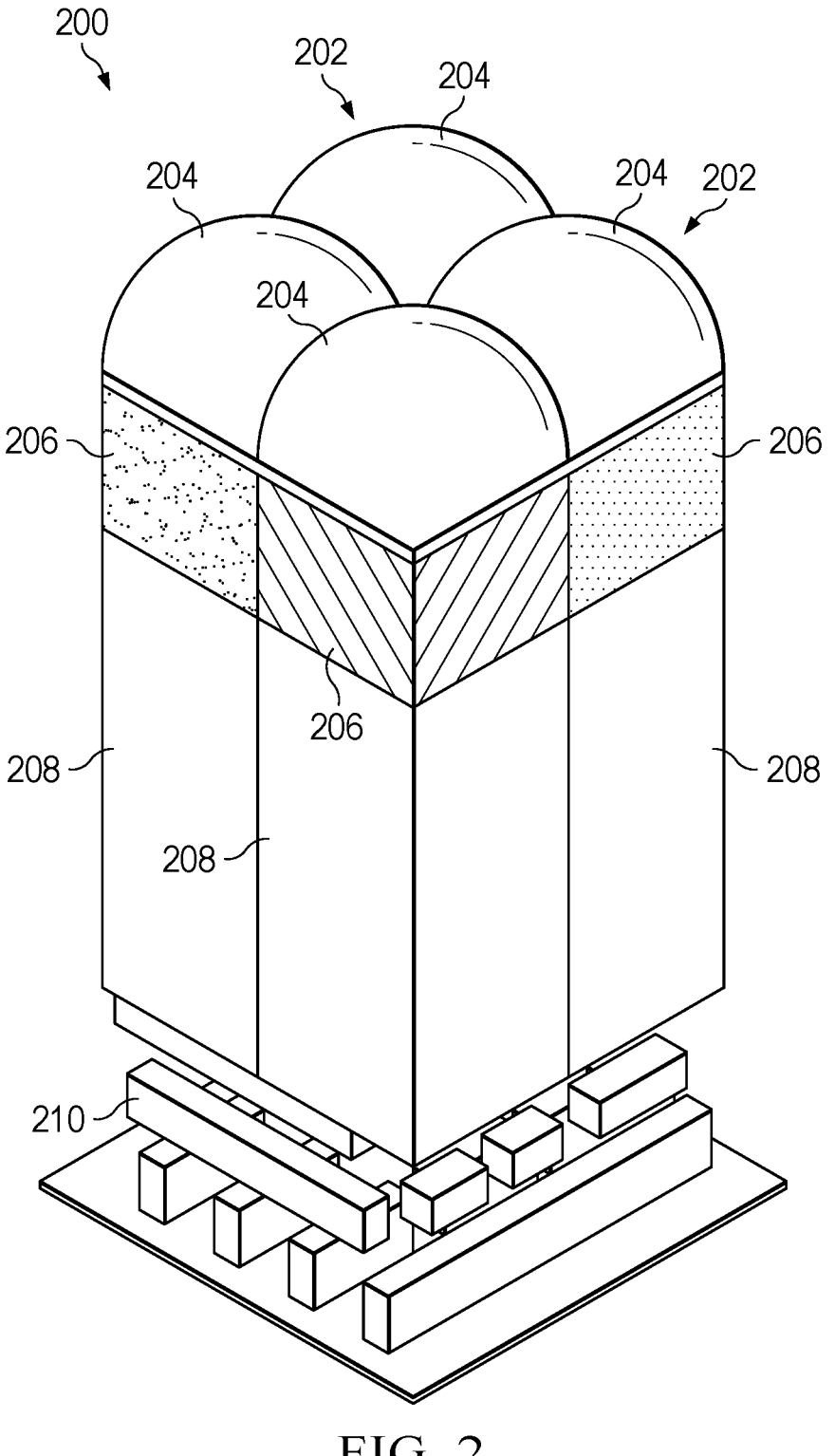
FIG. 2 is a perspective view of an example structure of a complementary metal-oxide semiconductor (CMOS) sensor, according to an embodiment.

FIG. 2 is a perspective view of an example structure of a CMOS sensor 200, according to an embodiment. The CMOS sensor 200 includes a plurality of pixels 202. Each pixel 202 includes a microlens 204, configured to concentrate light through a color filter 206 and onto the center of photodiode 208. The color filter 206 passes only red, green, or blue (RGB) colored light. The photodiode 208 is configured to convert the light into electrons. A pixel source follower (SF) transistor amplifier converts the electrons into an analog voltage signal. An analog to digital converter 210 converts the analog voltage signal into a digital signal which can be further processed by an image signal processor (ISP) to perform various image processes on the digital signal. In some embodiments, each pixel 202 is isolated from each other using physical isolation, e.g., deep trench isolation (DTI).

Figure 3:
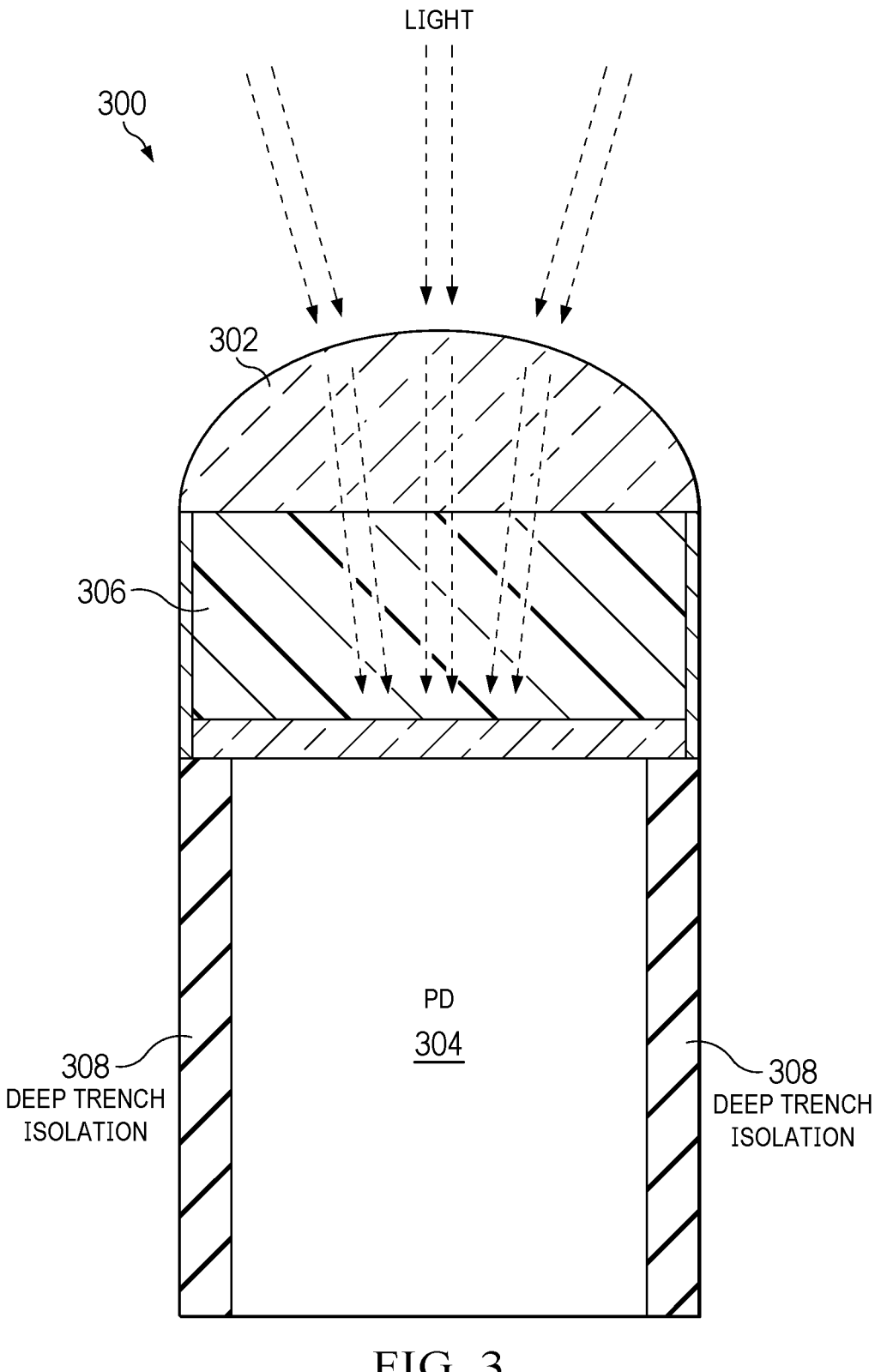
FIG. 3 is a cross-section view of an image sensor pixel, according to an embodiment.

FIG. 3 is a cross-section view of an image sensor pixel, according to an embodiment. The pixel 300 of FIG. 3 is an imaging pixel, instead of a PDAF pixel. The pixel 300 includes a convex or elliptical microlens 302 that focuses incoming light through a color filter 306 and onto a photodiode 304. The photodiode 304 converts photons into electron-hole pairs. The electrons or holes are converted to an analog voltage by a pixel SF transistor amplifier. The analog voltage is then converted to a digital signal by an analog-to-digital converter. The pixel 300 also includes a physical isolation 308, e.g., DTI, to get isolated from other pixels.

Figure 4A:
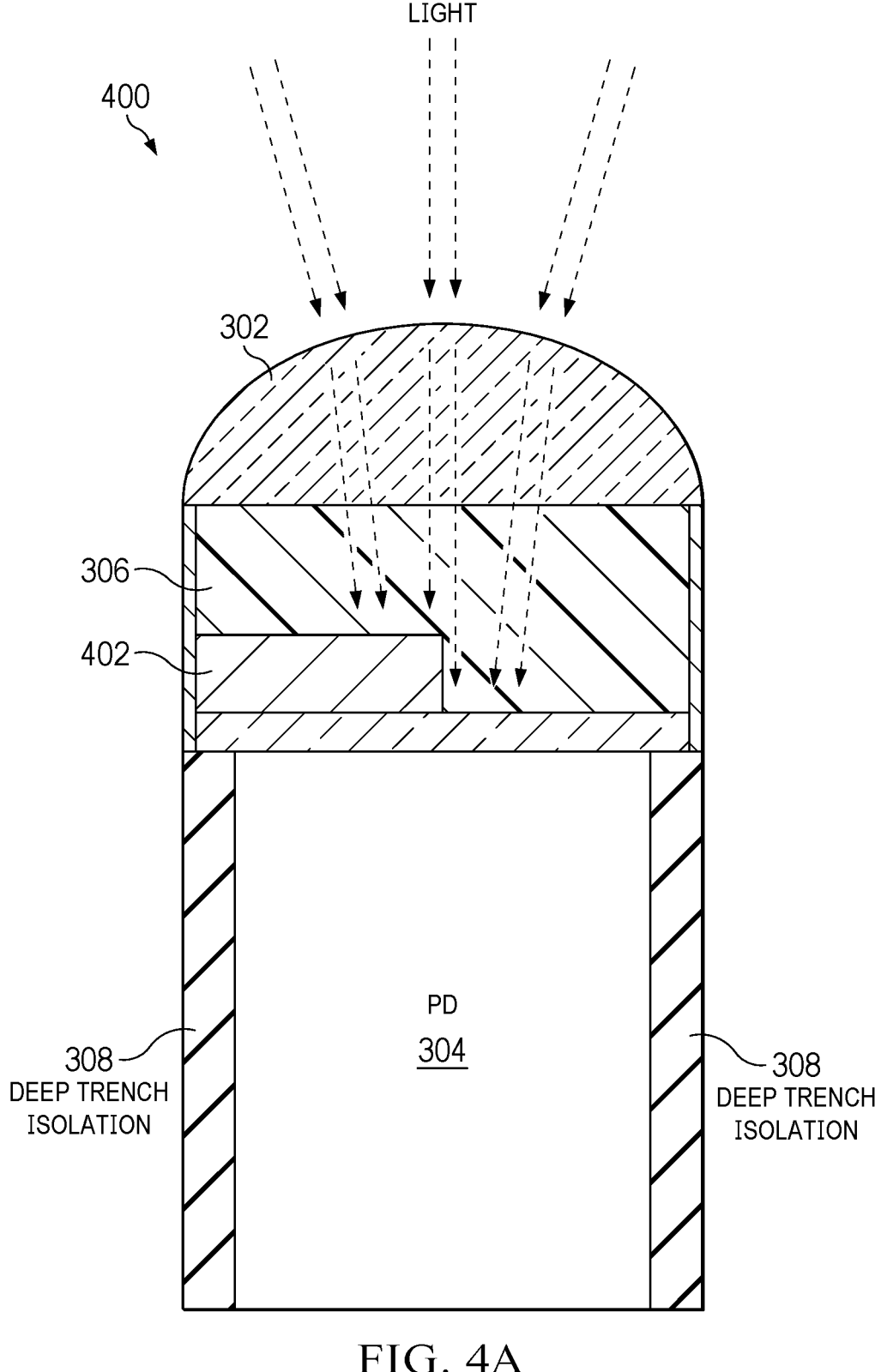
FIGS. 4A and 4B are cross-section views of a metal shielded PDAF pixel, according to an embodiment.
Figure 4B:
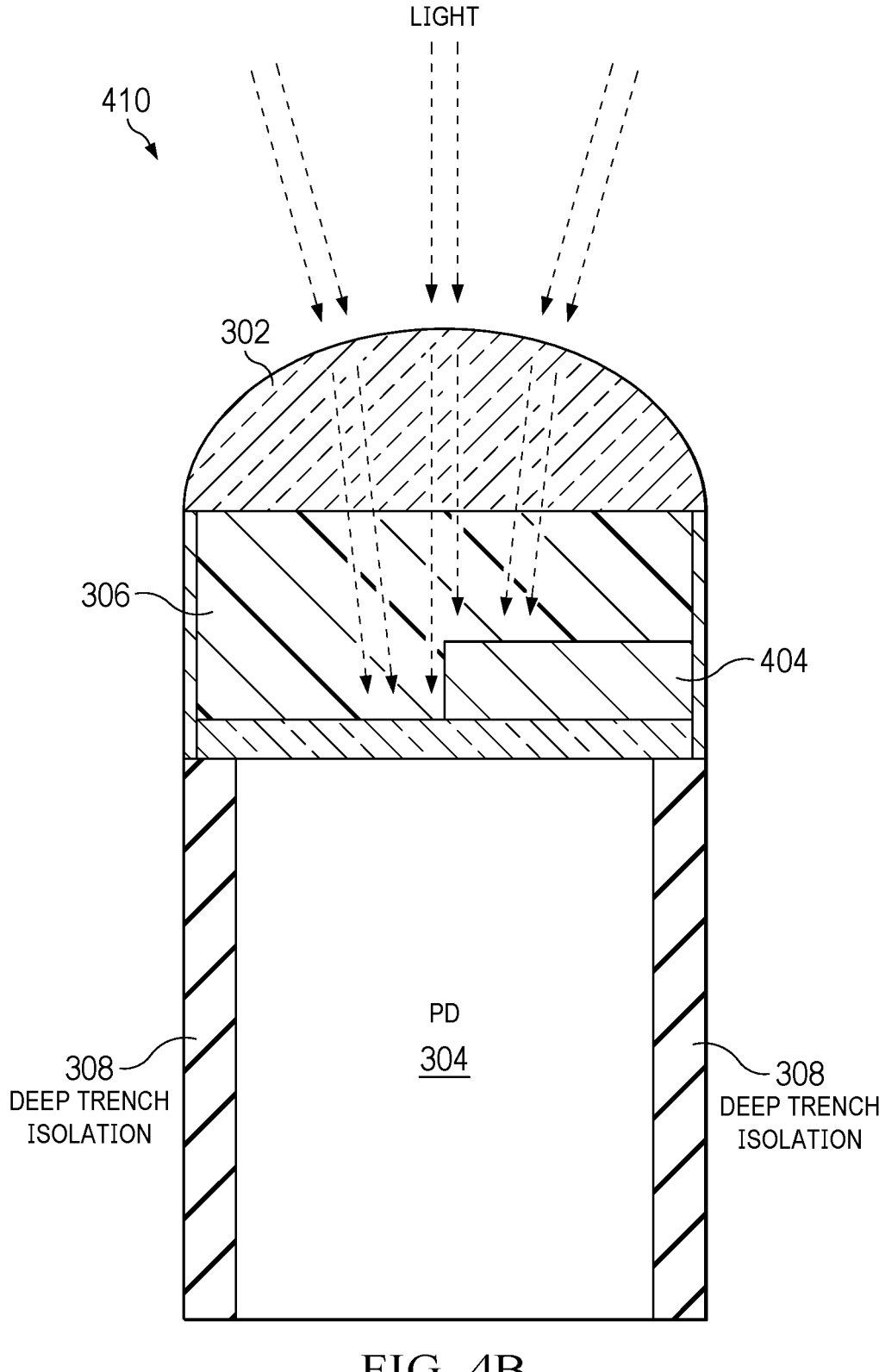

FIGS. 4A and 4B are cross-section views of a metal shielded PDAF pixel, according to an embodiment. As shown in FIG. 4A, the left half of the PDAF pixel 400 is covered by a metal shield 402 (e.g., Tungsten, Copper, or Aluminum metal layer). The light from a left side angle is blocked by the metal shield 402, and only light coming from the right side is collected by the photodiode 304. As shown in FIG. 4B, the right half of the PDAF pixel 410 is covered by a metal shield 404, light from the right side is blocked by the metal shield 404, and only light from a left side angle is collected by the photodiode 304. The angular response difference between the PDAF pixels shown in FIG. 4A and FIG. 4B is used to generate a phase disparity signal which is used by an autofocus system to adjust a primary lens of the camera to focus the image.

Figure 5A:
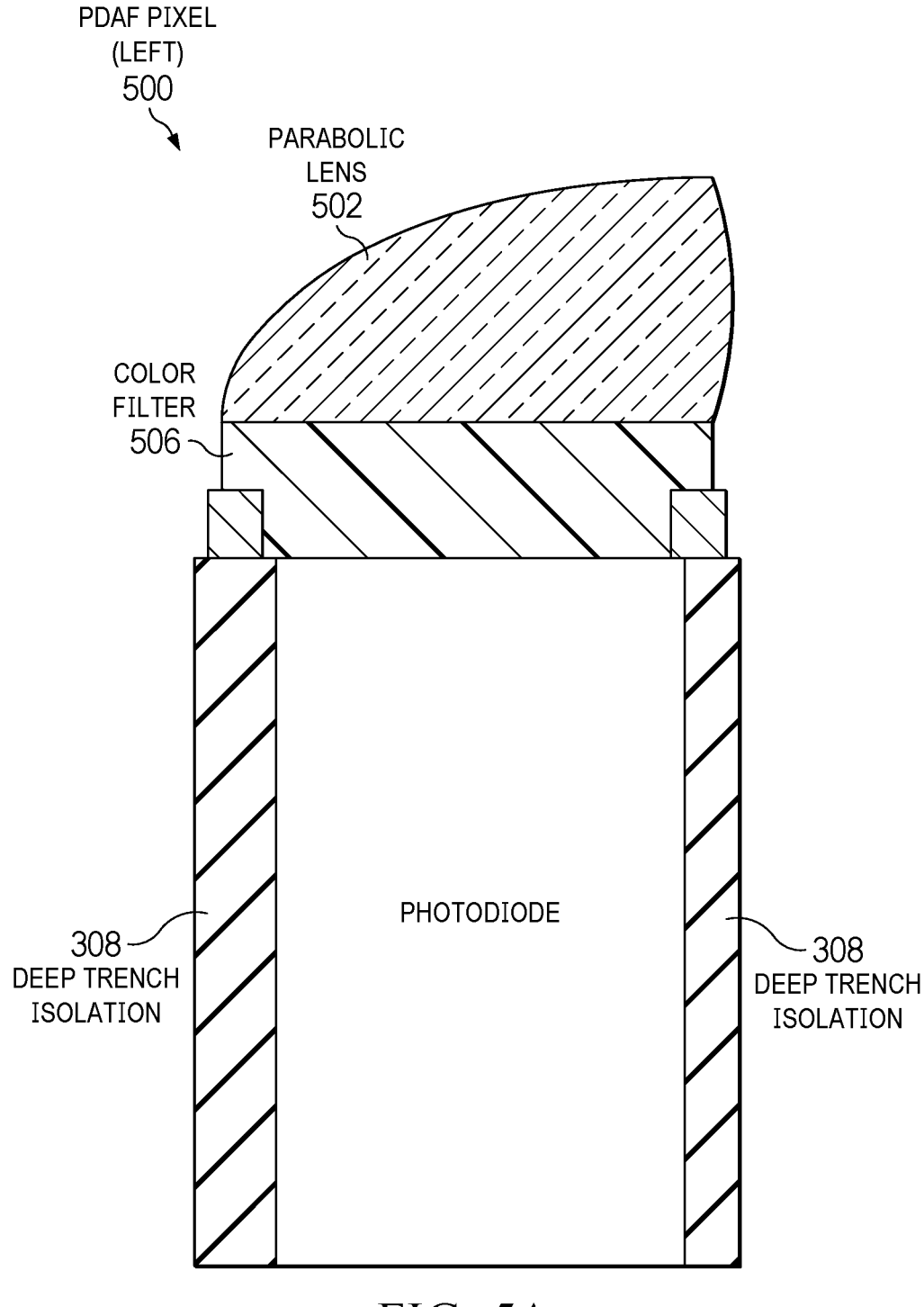
FIGS. 5A and 5B are cross-section views of a PDAF pixel, according to an embodiment.
Figure 5B:
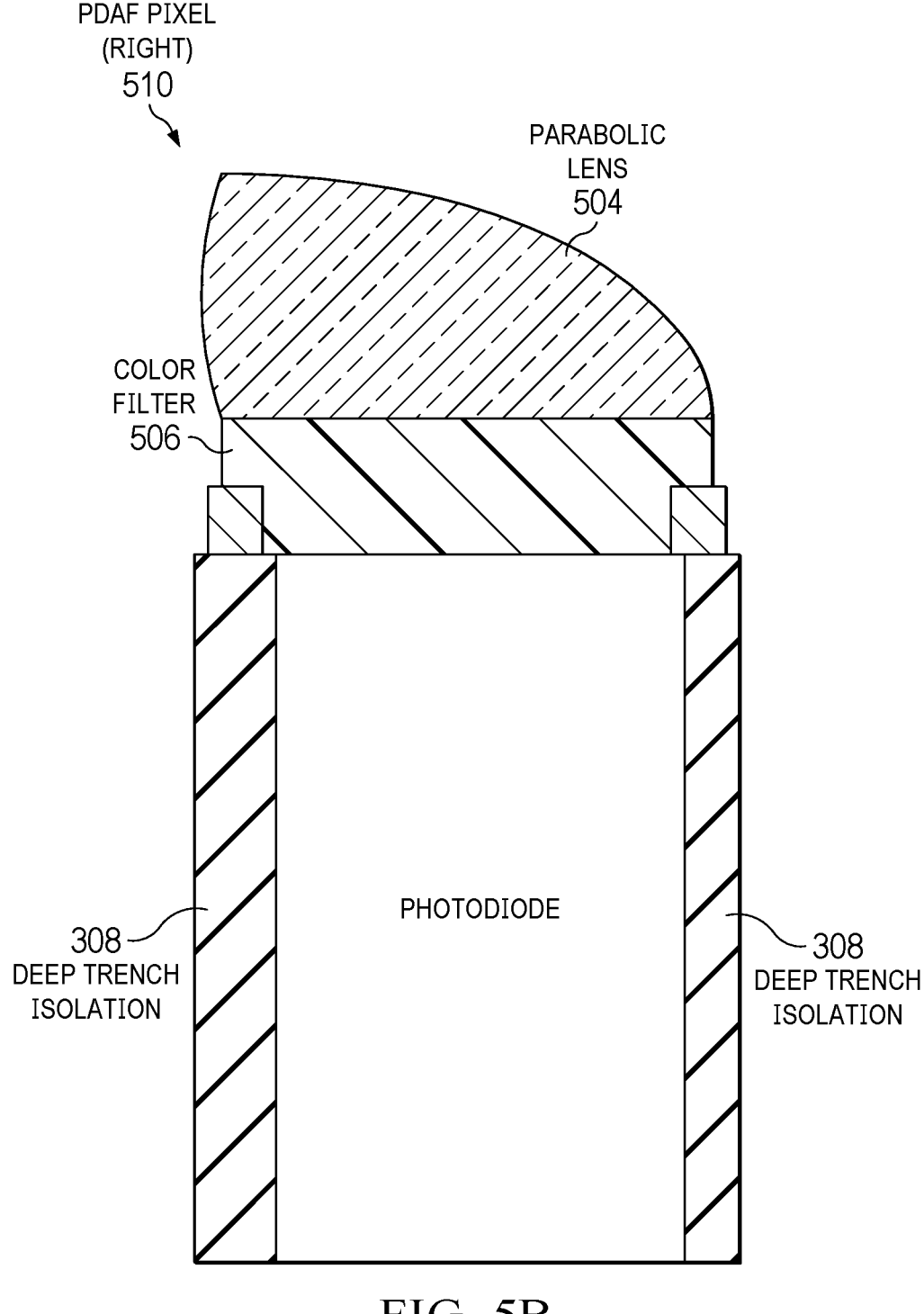
Figure 6A:
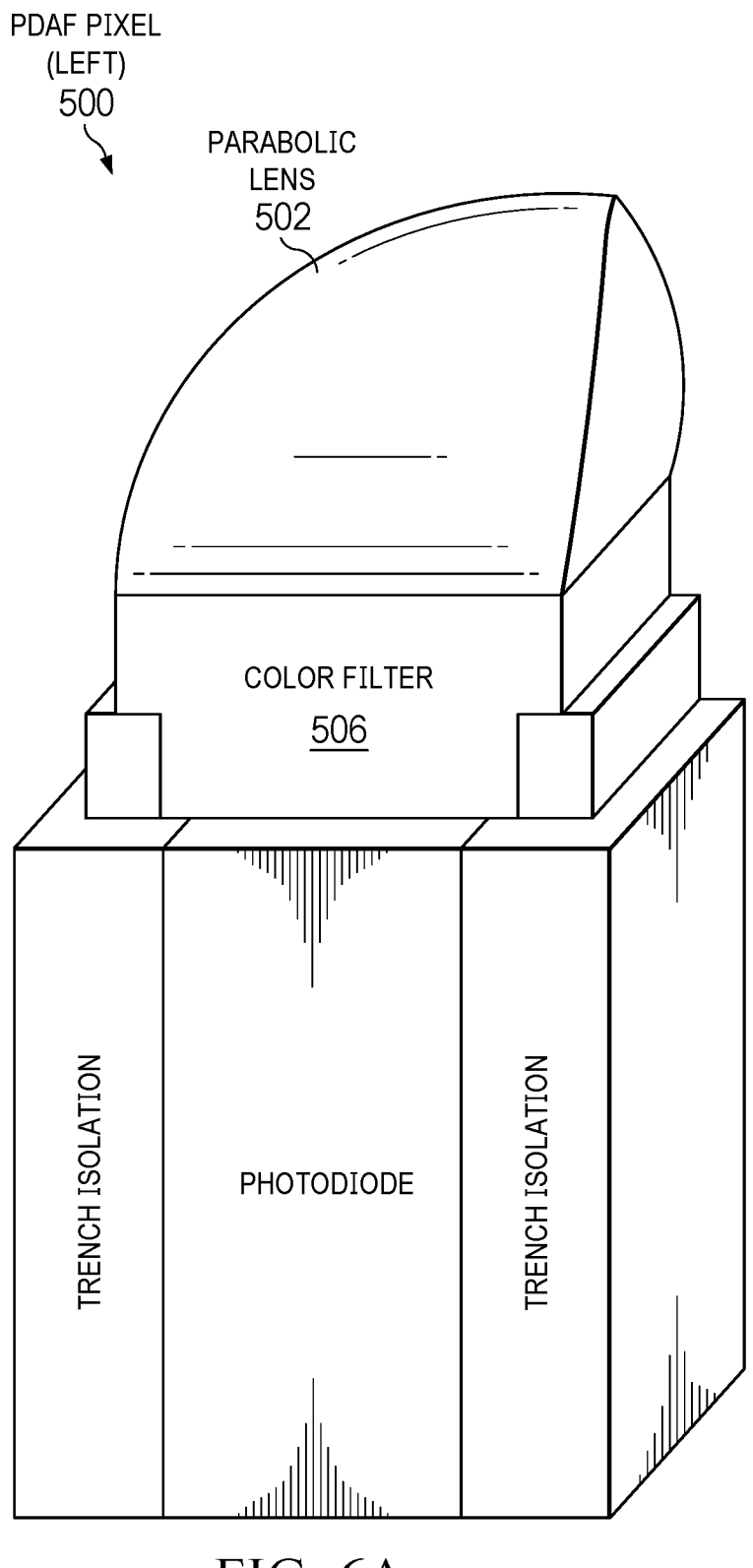
FIGS. 6A and 6B are three-dimensional perspective views of a PDAF pixel, according to an embodiment.
Figure 6B:
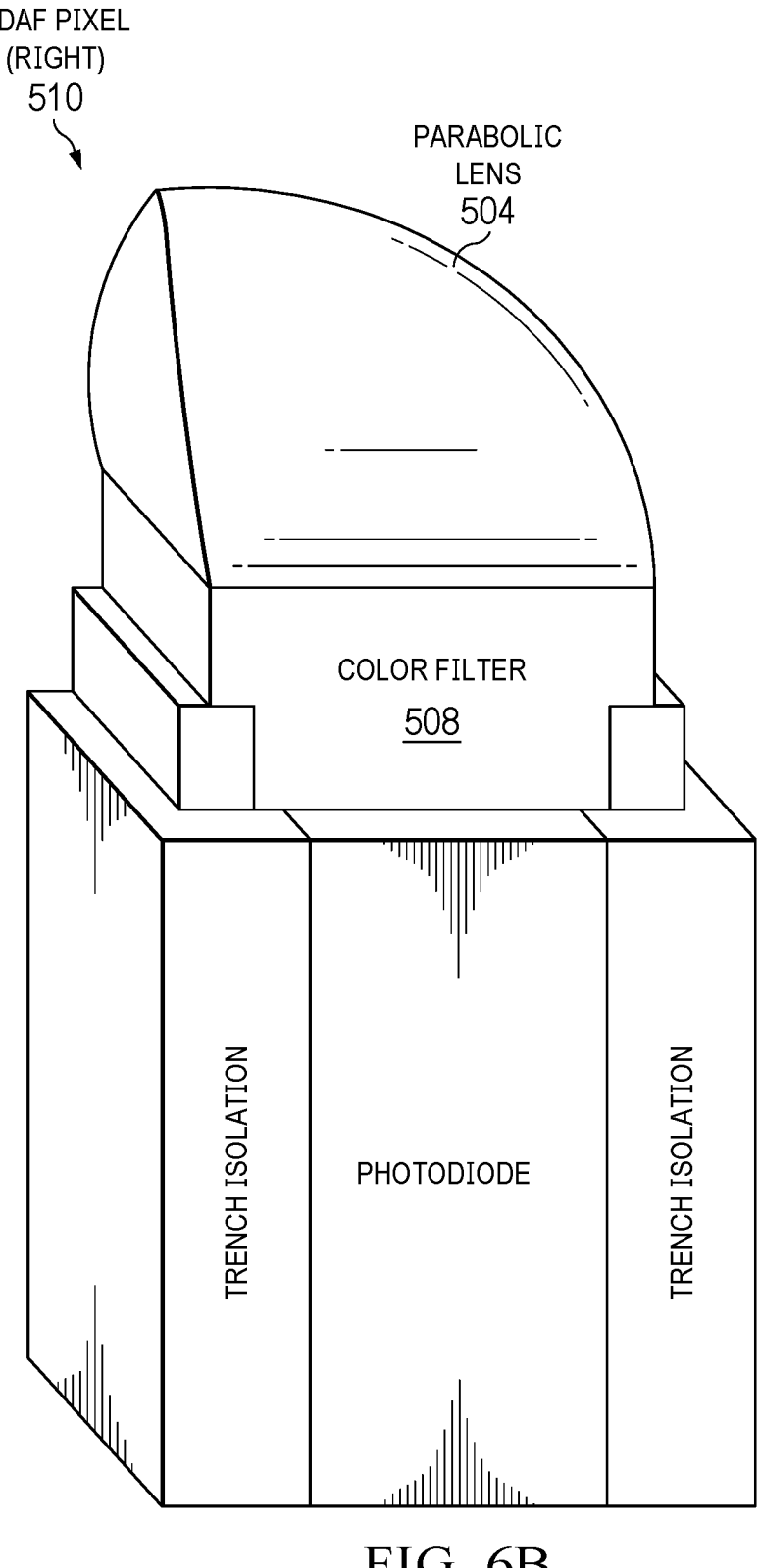

FIGS. 5A and 5B are cross-section views of a PDAF pixel, according to an embodiment. The difference between the PDAF pixels 500, 510 and the imaging pixel 300 is that the microlenses 502, 504 are parabolic-shaped. Unlike PDAF pixels of FIGS. 4A and 4B, no metal shield is provided to block incoming light, enabling improved low light performance of autofocusing. FIGS. 6A and 6B are three-dimensional perspective views of a PDAF pixel, according to an embodiment. As shown in FIG. 5A and FIG. 6A, a vertex 506 of the microlens 502 is facing towards the left; as shown in FIG. 5B and FIG. 6B, a vertex 508 of the microlens 504 is facing towards the right. The parabolic-shaped (e.g., semi-elliptical shaped) microlenses 502, 504 are asymmetric, and the shape of each parabolic microlens 502, 504 is similar to a half of the convex or elliptical microlens 302 of FIG. 3. The top view and the side view of the microlens 502, 504 can illustrate a shape of a parabola.

Figure 7A:
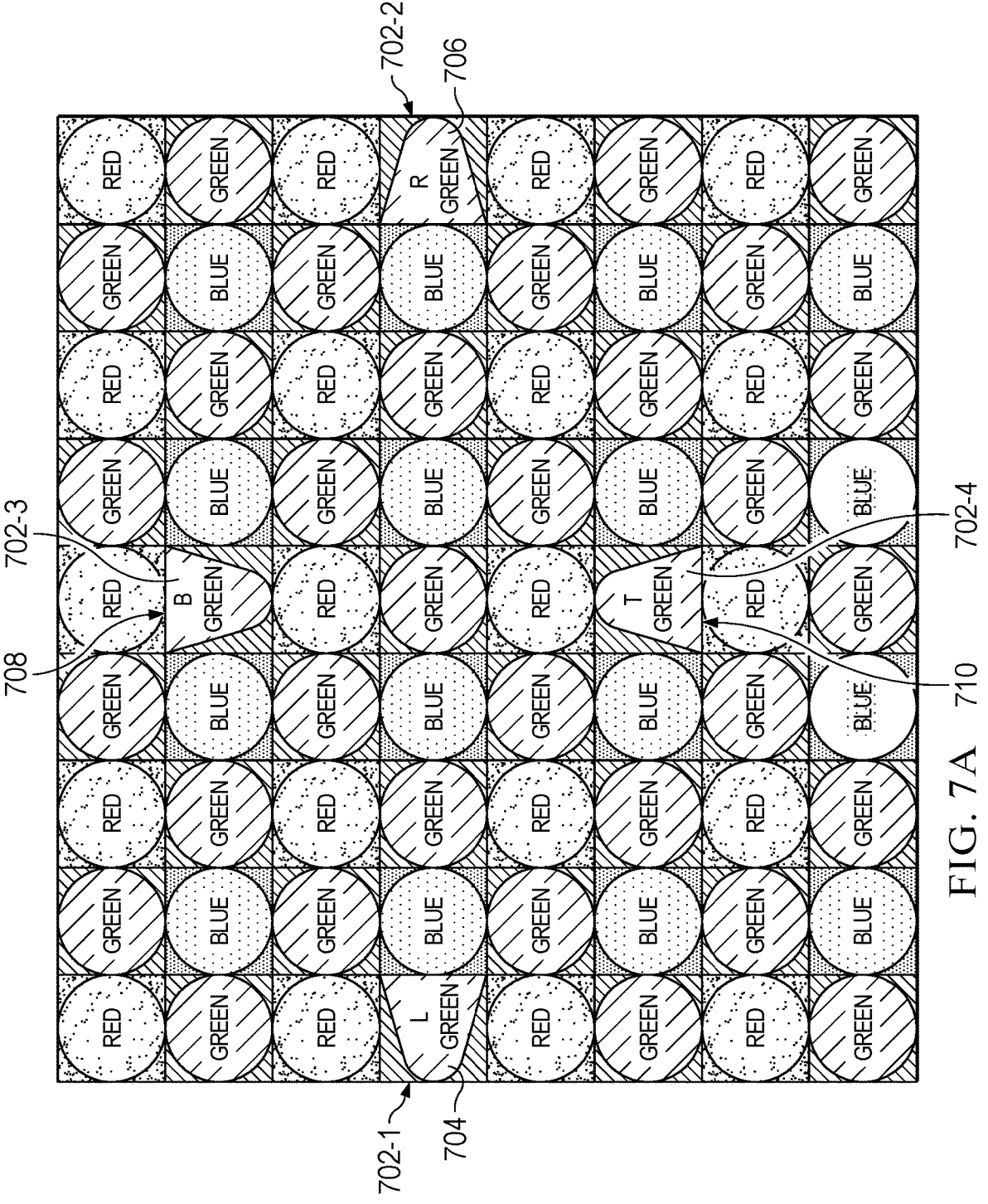
FIGS. 7A and 7B are perspective views of example pixel configurations of a CMOS sensor, according to an embodiment.
Figure 7B:
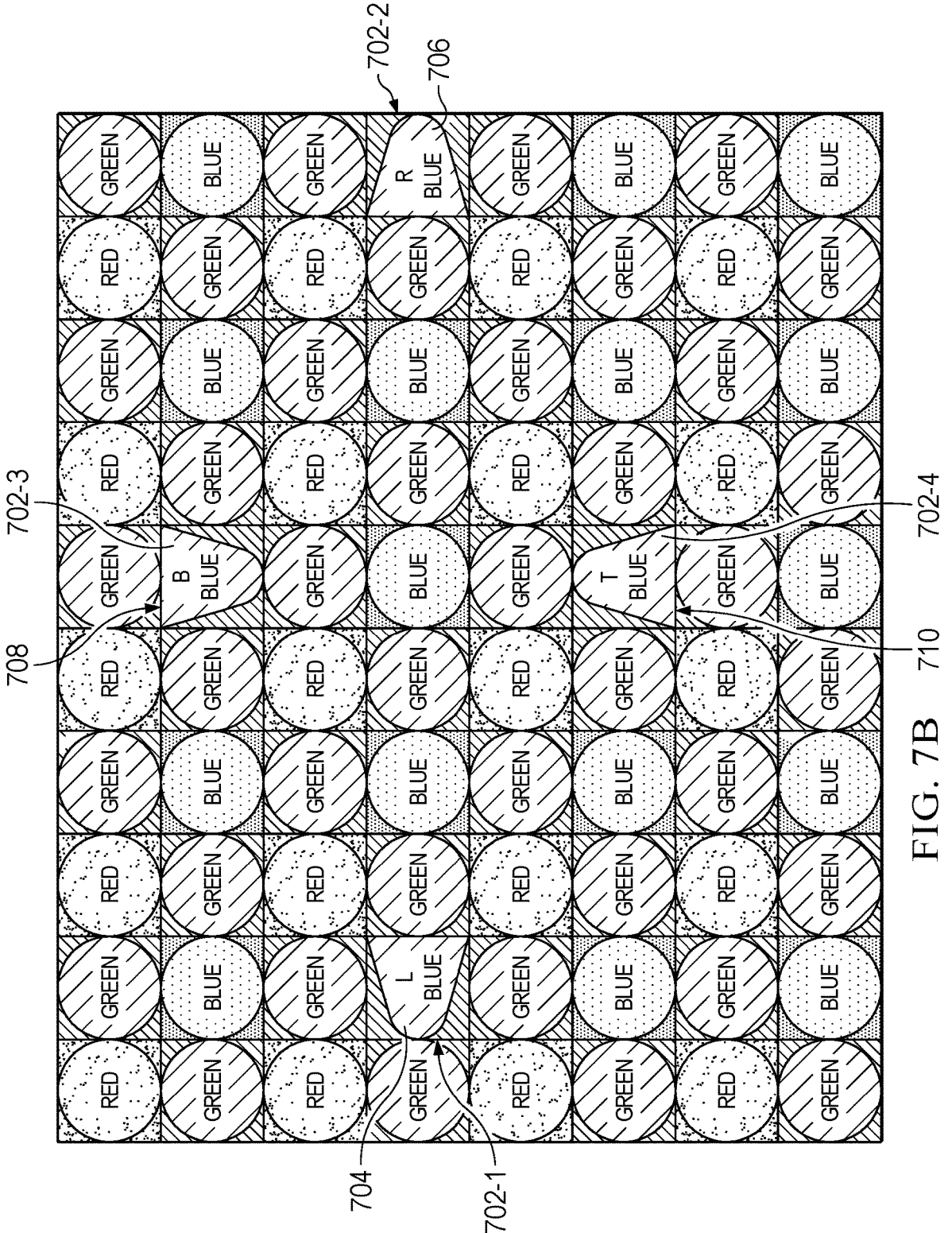

FIGS. 7A and 7B are perspective views of example pixel configurations of a CMOS sensor, according to an embodiment. As shown in FIG. 7A, there are a plurality of PDAF pixels (e.g., four PDAF pixels) 702 (702-1, 702-2, 702-3, 702-4) in a pixel array 700. Each PDAF pixel 702 includes a parabolic-shaped microlens 704, 706, 708, or 710 to generate an angular response, such that a phase disparity signal can be generated in an either horizontal or vertical direction of the imaging plane or both directions. In some embodiments, four PDAF pixels are placed on four green color channels (each green color channel includes a green color filter), each with a parabolic-shaped microlens 704, 706, 708, or 710 in a different orientation relative to each other. For example, a vertex of the microlens 704 is facing towards the left of the imaging plane; a vertex of the microlens 706 is facing towards the right of the imaging plane; a vertex of the microlens 708 is facing towards the top of the imaging plane; and a vertex of the microlens 710 is facing towards the bottom of the imaging plane. The microlens 704 and the microlens 706 can provide a horizontal phase disparity signal, while the microlens 708 and the microlens 710 can provide a vertical phase disparity signal.

In some embodiments, the PDAF pixel 702-1 including microlens 704, and the PDAF pixel 702-2 including microlens 706 have different angular responses. The angular response difference results in a maximum phase disparity signal in a horizontal direction of the imaging plane. Phase disparity is maximized for contrast edges in an image along a vertical direction, while phase disparity is minimized for contrast edges in the image along a horizontal direction. In all other directions between the horizontal direction and the vertical direction, there is a phase disparity between the minimum phase disparity and the maximum phase disparity.

The PDAF pixel 702-3 including microlens 708 and the PDAF pixel 702-4 including microlens 710 have different angular responses. The angular response difference results in a maximum phase disparity signal in a vertical direction of the imaging plane. Phase disparity is maximized for contrast edges in an image along a horizontal direction, while phase disparity is minimized for contrast edges in the image along a vertical direction. In all other directions between the horizontal direction and the vertical direction, there is a phase disparity between the minimum phase disparity and the maximum phase disparity.

In some embodiments, each PDAF pixel 702 can generate a phase disparity signal with respect to an imaging pixel 300 of FIG. 3. The PDAF pixel 702-1 including microlens 704 and the PDAF pixel 702-2 including microlens 706 can respectively generate a phase disparity signal in a horizontal direction of the imaging plane; while the PDAF pixel 702-3 including microlens 708 and the PDAF pixel 702-4 including microlens 710 can respectively generate a phase disparity signal in a vertical direction of the imaging plane.

As shown in FIG. 7B, the pixel configuration of FIG. 7B is similar to that of FIG. 7A. The difference is that the four PDAF pixels are placed on four blue color channels. In some embodiments, a blue color filter in each of the four blue color channels is replaced with a green color filter. In some embodiments, the PDAF pixels can also be placed on red color channels.

In some embodiments, the number of PDAF pixels is not limited to four PDAF pixels. For example, the number of PDAF pixels can be two, six, eight, etc. However, the PDAF pixels are defective pixels, and the larger number of PDAF pixels may impact image quality.

Compared with metal shielded PDAF pixels 400, 410 of FIGS. 4A and 4B, the unshielded PDAF pixels 702 (702-1, 702-2, 702-3, 702-4) including parabolic-shaped microlens 704, 706, 708, or 710, can provide a higher signal to noise ratio (SNR), enabling improved low light performance of autofocus, because all of pixel areas (PDAF pixels 702 unshielded) can be used to collect light that is converted to an electrical signal.

Furthermore, by placing PDAF pixels on color channels (e.g., a blue channel or a red channel), instead of on a green channel, the impact on image quality can be minimized during PDAF pixel correction processing. For Bayer RGB cameras, a demosaicing algorithm can produce superior results with green channel information as pristine as possible.

The PDAF pixels 702 (702-1, 702-2, 702-3, 702-4) of FIGS. 7A and 7B can provide both a horizontal phase disparity signal and a vertical phase disparity signal, such that phase disparity can be extracted for varied scenes with various "edges" or boundaries across which signal level changes significantly, e.g., in a horizontal direction of the imaging plane, in a vertical direction of the imaging plane, and in a direction between the horizontal direction and the vertical direction. Using the disclosed PDAF pixels with parabolic-shaped lenses, fast and accurate continuous focus can be achieved in a camera system across a broad range of scenes and lighting conditions.

Figure 8A:
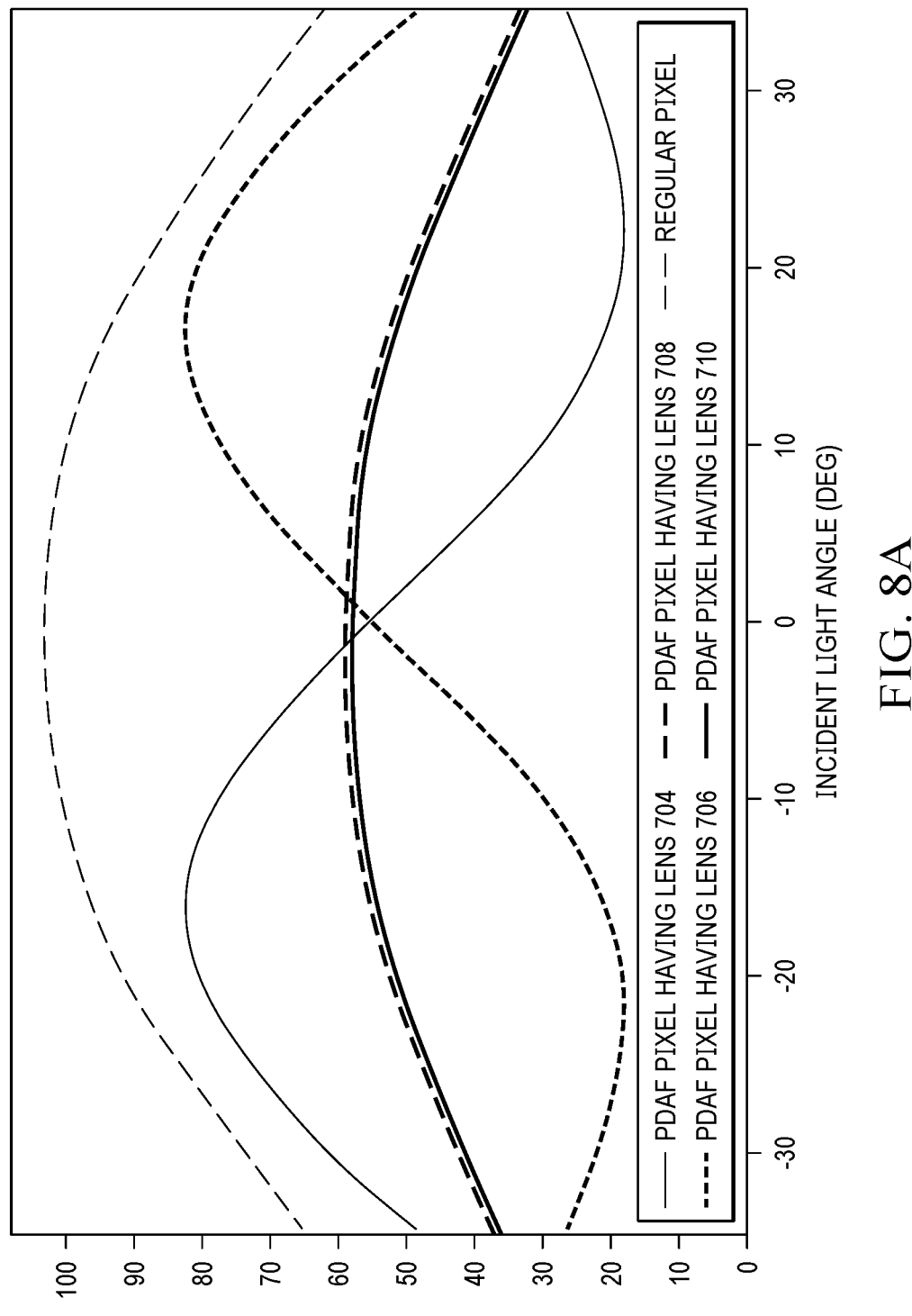
FIGS. 8A and 8B are angular response curves of PDAF pixels with respect to an imaging pixel, according to an embodiment.
Figure 8B:
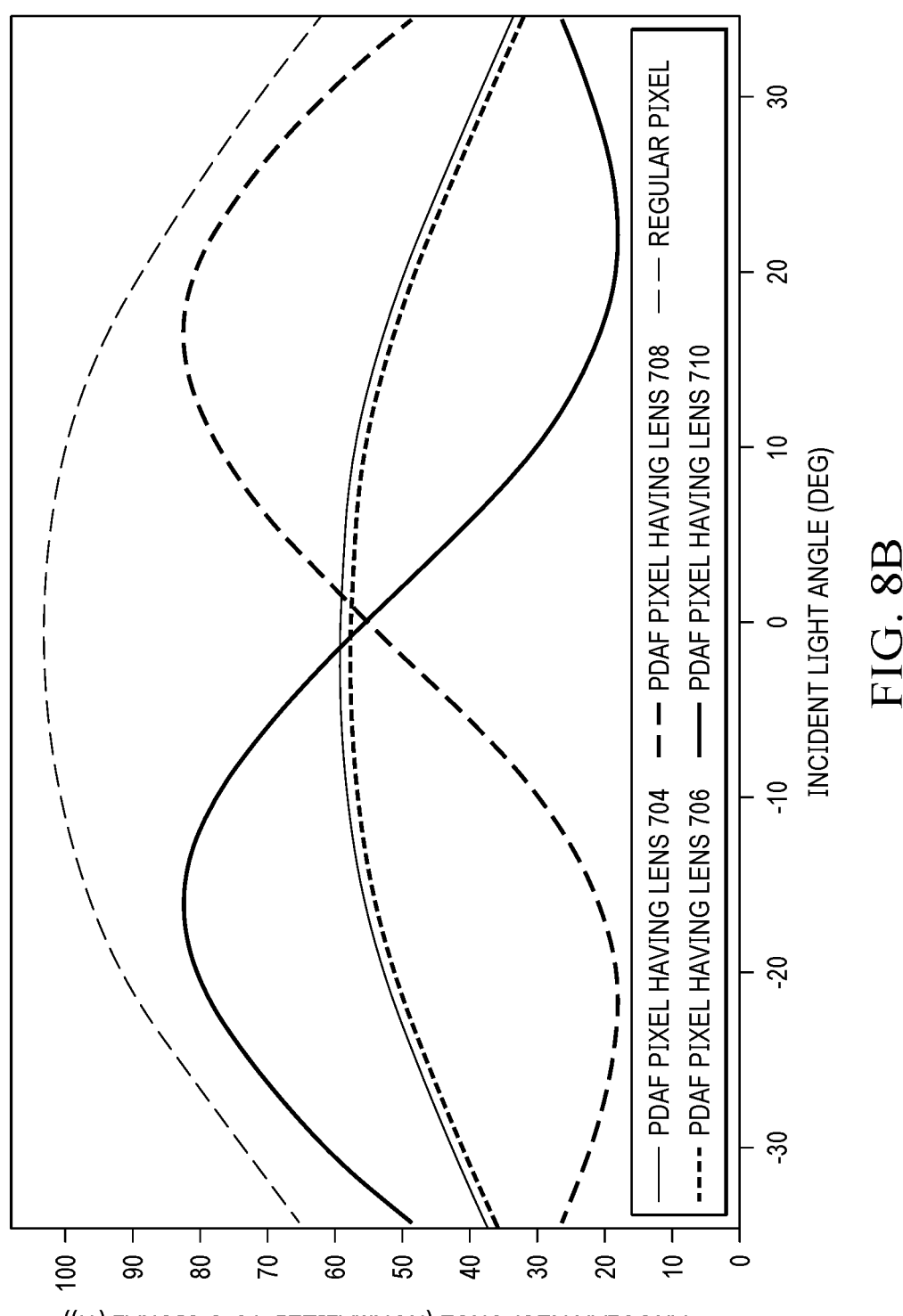

FIGS. 8A and 8B are angular response curves of PDAF pixels 702 with respect to an imaging pixel 300, according to an embodiment. FIG. 8A illustrates angular response curves in a horizontal direction of the imaging plane, while FIG. 8B illustrates angular response curves in a vertical direction of the imaging plane. As shown in FIG. 8A, the angular response difference between the PDAF pixel 702-1 having microlens 704 and the PDAF pixel 702-2 having microlens 706 can result in a maximum phase disparity signal in a horizontal direction of the imaging plane, while the angular response difference between the PDAF pixel 702-3 having microlens 708 and the PDAF pixel 702-4 having microlens 710 is minimum (close to zero) in a horizontal direction of the imaging plane. As shown in FIG. 8B, the angular response difference between the PDAF pixel 702-3 having microlens 708 and the PDAF pixel 702-4 having microlens 710 can result in a maximum phase disparity signal in a vertical direction of the imaging plane, while the angular response difference between the PDAF pixel 702-1 having microlens 704 and the PDAF pixel 702-2 having microlens 706 is minimum (close to zero) in a vertical direction of the imaging plane. As shown in FIGS. 8A and 8B, PDAF pixels 702 (702-1, 702-2, 702-3, 702-4) including a parabolic-shaped microlens 704, 706, 708, or 710, can generate a phase disparity signal in either horizontal or vertical direction of the imaging plane, or both directions.

In the foregoing description, aspects and embodiments of the present disclosure have been described with reference to numerous specific details that can vary from implementation to implementation. Accordingly, the description and drawings are to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further comprising," in the foregoing description or following claims, what follows this phrase can be an additional step or entity, or a sub-step/ sub-entity of a previously-recited step or entity.

I claim:

1. A phase detection autofocus (PDAF) pixel, comprising:
a single photodiode;
a color filter disposed on the single photodiode; and
an asymmetric parabolic-shaped microlens disposed on the color filter and oriented in a direction that generates an angular response, such that a phase disparity signal is generated in a horizontal or vertical direction of an imaging plane or both directions.

2. An image sensor, comprising:
a plurality of imaging pixels and at least a pair of phase detection autofocus (PDAF) pixels;
wherein each PDAF pixel includes:
a single photodiode;
a color filter disposed on the single photodiode; and
an asymmetric parabolic-shaped microlens disposed on the color filter and oriented in a direction that generates an angular response, such that a phase disparity signal is generated in a horizontal or vertical direction of an imaging plane or both directions.

3. The image sensor of claim 2, wherein each PDAF pixel in the pair of PDAF pixels is placed on a green color channel of a pixel array.

4. The image sensor of claim 2, wherein each PDAF pixel in the pair of PDAF pixels is placed on a blue color channel of a pixel array, and the blue color channel includes a green color filter.

5. The image sensor of claim 2, wherein the pair of PDAF pixels includes a first PDAF pixel having an asymmetric parabolic-shaped microlens facing towards a first horizontal direction of the imaging plane and a second PDAF pixel having an asymmetric parabolic-shaped microlens facing towards a second horizontal direction opposite to the first horizontal direction.

6. The image sensor of claim 2, wherein the pair of PDAF pixels includes a first PDAF pixel having an asymmetric parabolic-shaped microlens facing towards a first vertical direction of the imaging plane and a second PDAF pixel having an asymmetric parabolic-shaped microlens facing towards a second vertical direction opposite to the first vertical direction.

7. The image sensor of claim 2, wherein the image sensor includes a first pair of PDAF pixels and a second pair of PDAF pixels, wherein the first pair of PDAF pixels are oriented to provide a first phase disparity signal in the horizontal direction of the imaging plane, and the second pair of PDAF pixels is oriented to provide a second phase disparity signal in the vertical direction of the imaging plane.

8. The image sensor of claim 7, wherein the first pair of PDAF pixels and the second pair of PDAF pixels are placed on a green color channel of a pixel array.

9. The image sensor of claim 7, wherein each PDAF pixel in the first pair of PDAF pixels and the second pair of PDAF pixels is placed on a blue color channel of a pixel array, and the blue color channel includes a green color filter.

10. The image sensor of claim 7, wherein the first pair of PDAF pixels includes a first PDAF pixel having an asymmetric parabolic-shaped microlens facing towards a first horizontal direction of the imaging plane and a second PDAF pixel having an asymmetric parabolic-shaped microlens facing towards a second horizontal direction opposite to the first horizontal direction, and the second pair of PDAF pixels includes a third PDAF pixel having an asymmetric parabolic-shaped microlens facing towards a first vertical direction of the imaging plane and a fourth PDAF pixel having an asymmetric parabolic-shaped microlens facing towards a second vertical direction opposite to the first vertical direction.

11. The image sensor of claim 2, wherein each imaging pixel includes a convex or elliptical shaped microlens.

12. A mobile device, comprising an image sensor, wherein the image sensor includes:

a plurality of imaging pixels and at least a pair of phase detection autofocus (PDAF) pixels;

wherein each PDAF pixel includes:

a single photodiode;

a color filter disposed on the single photodiode; and an asymmetric parabolic-shaped microlens disposed on the color filter and oriented in a direction that generates an angular response, such that a phase disparity signal is generated in a horizontal or vertical direction of an imaging plane or both directions.

13. The mobile device of claim 12, wherein each PDAF pixel in the pair of PDAF pixels is placed on a green color channel of a pixel array.

14. The mobile device of claim 12, wherein each PDAF pixel in the pair of PDAF pixels is placed on a blue color channel of a pixel array, and the blue color channel includes a green color filter.

15. The mobile device of claim 12, wherein the pair of PDAF pixels includes a first PDAF pixel having an asymmetric parabolic-shaped microlens facing towards a first horizontal direction and a second PDAF pixel having an asymmetric parabolic-shaped microlens facing towards a second horizontal direction opposite to the first horizontal direction.

16. The mobile device of claim 12, wherein the pair of PDAF pixels includes a first PDAF pixel having an asymmetric parabolic-shaped microlens facing towards a first vertical direction of the imaging plane and a second PDAF pixel having an asymmetric parabolic-shaped microlens facing towards a second vertical direction opposite to the first vertical direction.

17. The mobile device of claim 12, wherein the image sensor includes a first pair of PDAF pixels and a second pair of PDAF pixels, wherein the first pair of PDAF pixels is oriented to provide a first phase disparity signal in the horizontal direction, and the second pair of PDAF pixels is oriented to provide a second phase disparity signal in the vertical direction.

18. The mobile device of claim 17, wherein each PDAF pixel in the first pair of PDAF pixels and the second pair of PDAF pixels is placed on a green color channel of a pixel array.

19. The mobile device of claim 17, wherein each PDAF pixel in the first pair of PDAF pixels and the second pair of PDAF pixels is placed on a blue color channel of a pixel array, and the blue color channel includes a green color filter.

20. The mobile device of claim 17, wherein the first pair of PDAF pixels includes a first PDAF pixel having an asymmetric parabolic-shaped microlens facing towards a first horizontal direction of the imaging plane and a second PDAF pixel having an asymmetric parabolic-shaped microlens facing towards a second horizontal direction opposite to the first horizontal direction, and the second pair of PDAF pixels includes a third PDAF pixel having an asymmetric parabolic-shaped microlens facing towards a first vertical direction of the imaging plane and a fourth PDAF pixel having an asymmetric parabolic-shaped microlens facing towards a second vertical direction opposite to the first vertical direction.

* * * * *